(12) United States Patent
Perrin

(10) Patent No.: US 6,761,804 B2
(45) Date of Patent: Jul. 13, 2004

(54) INVERTED MAGNETRON

(75) Inventor: Mark A. Perrin, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 186 days.

(21) Appl. No.: 10/074,855

(22) Filed: Feb. 11, 2002

(65) Prior Publication Data

US 2003/0150721 A1 Aug. 14, 2003

(51) Int. Cl.[7] .............................................. C23C 14/35
(52) U.S. Cl. ........................... 204/192.12; 204/298.09; 204/298.12; 204/298.14; 204/298.17; 204/298.18; 204/298.19; 204/298.21
(58) Field of Search ........................ 204/192.12, 192.17, 204/298.09, 298.12, 298.14, 298.16, 298.17, 298.18, 298.19, 298.21, 298.22

(56) References Cited

U.S. PATENT DOCUMENTS

| | | | | |
|---|---|---|---|---|
| 3,878,085 A | * | 4/1975 | Corbani | 204/298.21 |
| 4,116,791 A | | 9/1978 | Zega | 427/524 |
| 4,774,437 A | | 9/1988 | Helmer et al. | 315/111.81 |
| 4,865,712 A | | 9/1989 | Mintz | 204/298.16 |
| 4,960,753 A | | 10/1990 | Collins et al. | 204/298.06 |
| 5,080,772 A | * | 1/1992 | Hurwitt et al. | 204/192.12 |
| 5,158,660 A | | 10/1992 | Devigne et al. | 204/298.21 |
| 5,178,739 A | | 1/1993 | Barnes et al. | 204/192.12 |
| 5,288,971 A | | 2/1994 | Knipp | 219/121.57 |
| 5,505,780 A | | 4/1996 | Dalvie et al. | 118/723 MA |
| 5,681,434 A | | 10/1997 | Eastlund | 204/156 |
| 5,772,772 A | | 6/1998 | Chi | 118/723 MA |
| 6,077,406 A | | 6/2000 | Kawakubo et al. | 209/298.12 |
| 6,150,628 A | | 11/2000 | Smith et al. | 219/121.54 |
| 6,251,242 B1 | | 6/2001 | Fu et al. | 204/298.19 |
| 6,337,001 B1 | * | 1/2002 | Haag et al. | 204/192.2 |

FOREIGN PATENT DOCUMENTS

| | | |
|---|---|---|
| JP | 61284573 | 12/1986 |
| WO | 9900823 | 1/1999 |

OTHER PUBLICATIONS

Chapman, Brian. "Glow Discharge Processes: Sputtering & Plasma Etching," John Wiley & Sons, NY, 1980: pp. 257–258.

Kitamoto, Y., et al., "Compact Sputtering Apparatus for Depositing Co–Cr Alloy Thin Films in Magnetic Disks," Proc. of the 4th ISSP, Japan, 1997: pp. 519–522.

Musil, J., et al., "Unbalanced Magnetrons and New Sputtering Systems with Enhanced Plasma Ionization," J. Vac. Sci. Tech., A 9 (3), May/Jun. 1991; pp. 1171–1177.

Yamazato, M., et al. "Preparation of TiN Thin Films by Facing Targets Magnetron Sputtering," Proc. of the 4th ISSP, Japan, 1997: pp. 635–638.

* cited by examiner

*Primary Examiner*—Rodney G. McDonald
(74) *Attorney, Agent, or Firm*—Konrad, Raynes & Victor LLP

(57) ABSTRACT

A source of sputtered deposition material has, in one embodiment, a torus-shaped plasma generation area in which a plasma operates to sputter the interior surface of a toroidal cathode. In one embodiment, the sputtered deposition material passes to the exterior of the source through apertures provided in the cathode itself. A torus-shaped magnetic field generated in the torus-shaped plasma facilitates plasma generation, sputtering of the cathode and ionization of the sputtered material by the plasma.

44 Claims, 9 Drawing Sheets

INVERTED MAGNETRON

FIELD OF THE INVENTION

The invention relates generally to a magnetron for deposition of sputtered material onto a semiconductor substrate.

BACKGROUND ART

A semiconductor integrated circuit contains many layers of different materials usually classified according to whether the layer is a semiconductor, a dielectric (electrical insulator) or metal. However, some materials such as barrier materials, for example, TiN, are not so easily classified. The two principal current means of depositing metals and barrier materials are sputtering, also referred to as physical vapor deposition (PVD), and chemical vapor deposition (CVD).

One conventional sputter reactor has a planar target in parallel opposition to the wafer or other semiconductor substrate being sputter deposited. A negative DC voltage is applied to the target sufficient to ionize the argon working gas into a plasma. The positive argon ions are attracted to the negatively charged target with sufficient energy to sputter atoms of the target material. Some of the sputtered atoms strike the wafer and form a sputter coating thereon. Often a magnetron is positioned in back of the target to create a magnetic field adjacent to the target. The magnetic field traps electrons, and, to maintain charge neutrality in the plasma, the ion density increases also. As a result, the plasma density and sputter rate are increased. The conventional magnetron generates a magnetic field principally lying parallel to the target.

Much effort has been expended to allow sputtering to effectively coat metals and barrier materials deep into narrow holes. High-density plasma (HDP) sputtering has been developed in which the argon working gas is excited into a high-density plasma. Typically, an HDP sputter reactor uses an RF power source connected to an inductive coil adjacent to the plasma region to generate the high-density plasma. The high argon ion density causes a significant fraction of sputtered atoms to be ionized. If the pedestal electrode supporting the wafer being sputter coated is negatively electrically biased, the ionized sputter particles are accelerated toward the wafer to form a directional beam that reaches deeply into narrow holes.

Another sputtering technology, referred to as self-ionized plasma (SIP) sputtering, has been developed to fill deep holes. See, for example, U.S. patent application Ser. No. 09/373,097 filed Aug. 12, 1999 by Fu and U.S. patent application filed Oct. 8, 1999 by Chiang et al. In one implementation, SIP uses a capacitively coupled plasma sputter reactor having a planar target in parallel opposition to the wafer being sputter coated. A magnetron positioned in back of the target increases the plasma density and hence the sputtering rate. In some implementations, the target is separated from the wafer by a large distance to effect long-throw sputtering, which enhances collimated sputtering. Asymmetric magnetic pole pieces cause the magnetic field to have a significant vertical component extending far towards the wafer, thus extending the high-density plasma volume and promoting transport of ionized sputter particles.

The SIP technology can be used for sustained self-sputtering (SSS) in which a sufficiently high number of sputter particles are ionized that they may be used to further sputter the target and no argon working gas is required. Of the metals commonly used in semiconductor fabrication, copper is susceptible to SSS resulting from its high self-sputtering yield.

The extremely low pressures and relatively high ionization fractions associated with SSS are advantageous for filling deep holes with copper. However, it was quickly realized that the SIP technology could be advantageously applied to the sputtering of aluminum and other metals and even to copper sputtering at moderate pressures. SIP sputtering produces high quality films exhibiting high hole filling factors regardless of the material being sputtered. Other sputter geometries have been developed which increase the ionization density. One example is a multi-pole hollow cathode target, several variants of which are described by Barnes et al. in U.S. Pat. No. 5,178,739. Its target has a hollow cylindrical shape, usually closed with a circular back wall, and is electrically biased. Typically, a series of magnets, positioned on the sides of the cylindrical cathode of alternating magnetic polarization, create a magnetic field extending generally parallel to the cylindrical sidewall. Helmer et al. in U.S. Pat. No. 5,482,611 discusses a hollow cathode target in which an axially polarized tubular magnet surrounds the sides of the hollow cathode and extend in back of the cathode back wall to create a generally axial magnetic field but which forms a cusp at the cathode back wall. Another approach uses a pair of facing targets facing the lateral sides of the plasma space above the wafer.

BRIEF SUMMARY OF ILLUSTRATIVE EMBODIMENTS

A source of sputtered deposition material has, in one embodiment, a torus-shaped plasma generation area in which a plasma operates to sputter the interior surface of a cathode. In one embodiment, the sputtered deposition material may pass to the exterior of the source through apertures which may be provided in the cathode itself. The shapes and positions of the apertures may be selected to provide a particular deposition pattern.

In one embodiment, a torus-shaped magnetic field may be generated in the torus-shaped plasma to facilitate plasma generation, sputtering of the cathode and ionization of the sputtered material by the plasma. The magnetic field may be generated using permanent magnets or electromagnetic coils. The coils of the electromagnet may encircle the cathode or may be positioned coaxially with a central axis of the cathode.

In one embodiment, the cathode may be torus-shaped and a ring-shaped anode may be positioned inside the cathode. Alternatively, the cathode and anode may be formed from surfaces having a partial-torus shape.

In one embodiment, ionized deposition material may be attracted to the source apertures by potentials applied to a grill defining the apertures. The flow of ionized deposition material exiting the source may be deflected into particular trajectories by electric fields provided by a lens structure exterior to the source. The shapes and positions of the lens may be selected to provide a particular deposition pattern.

In one embodiment, both the chamber exterior and the cathode may be biased to a ground potential. A flow of coolant may be directed to the cathode such that the coolant is in thermal and electrical contact with the cathode.

There are additional aspects to the present inventions. It should therefore be understood that the preceding is merely a brief summary of some embodiments and aspects of the present inventions. Additional embodiments and aspects of the present inventions are referenced below. It should further be understood that numerous changes to the disclosed embodiments can be made without departing from the spirit or scope of the inventions. The preceding summary therefore

DETAILED DESCRIPTIONS OF EXEMPLARY EMBODIMENTS

Figure 1:
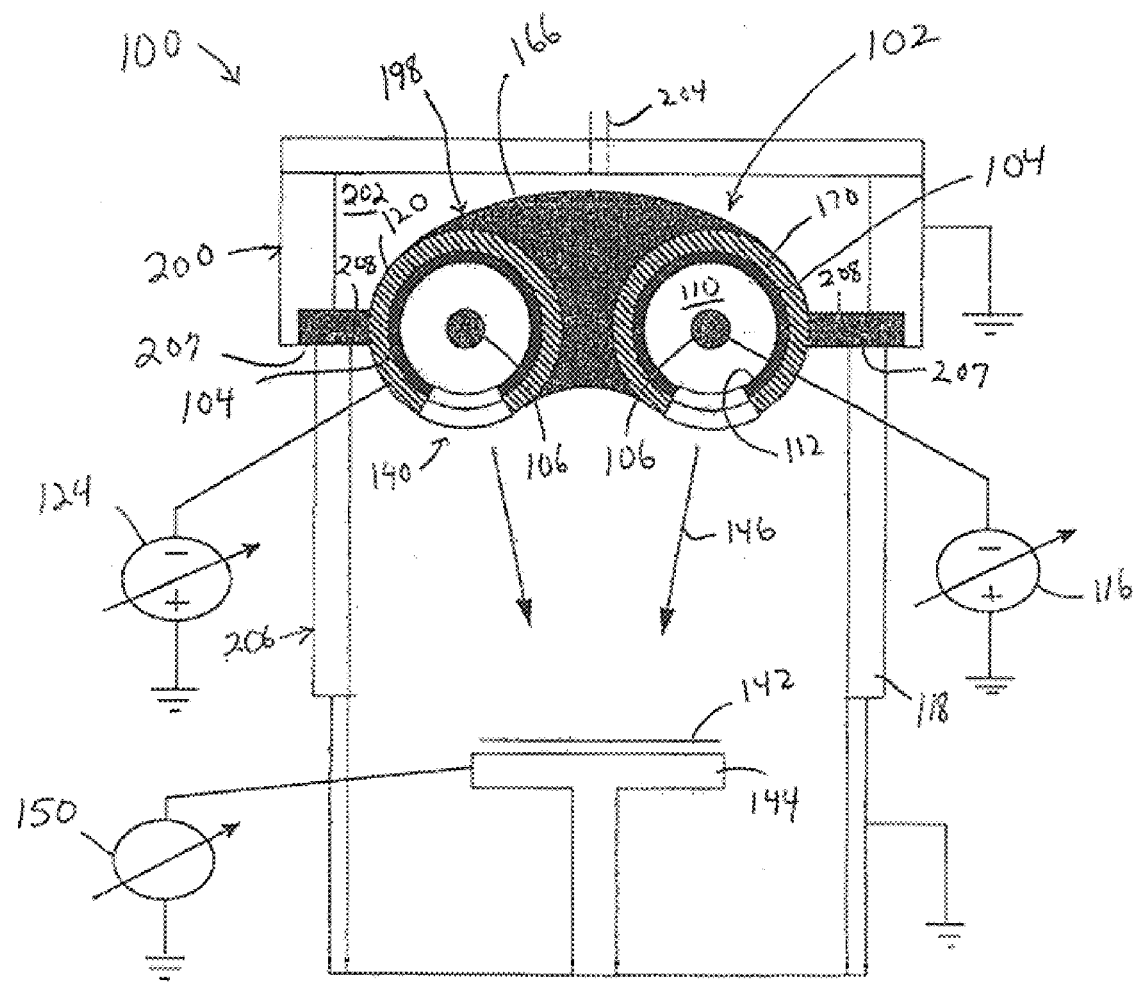
FIG. 1 is a schematic diagram of a deposition chamber in accordance with one embodiment in which a torus-shaped magnetron source is shown in cross-sectional elevational view.
Figure 2:
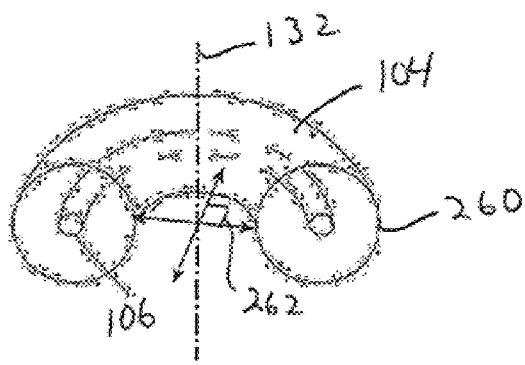
FIG. 2 is a cross-sectional elevational view of the cathode and anode of the source of FIG. 1.
Figure 3A:
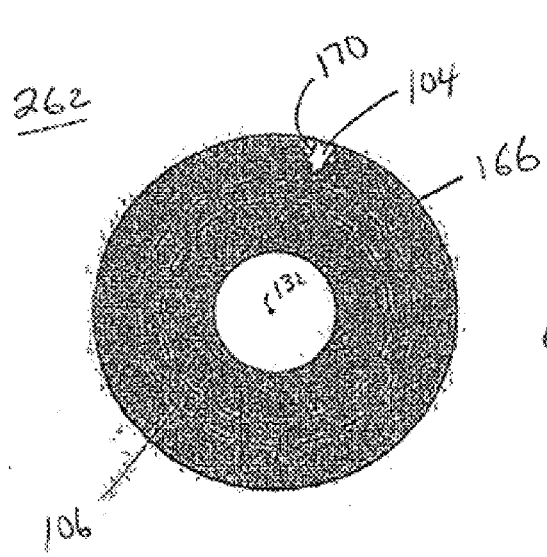
FIG. 3A is a top view of the cathode and anode of the source of FIG. 1.
Figure 3B:
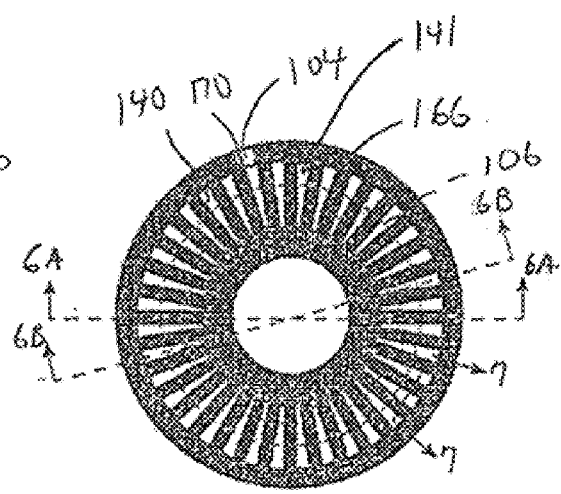
FIG. 3B is a bottom view of the cathode and anode of the source of FIG. 1.

A vacuum sputtering chamber in accordance with one embodiment of the present inventions is indicated generally at 100 in FIG. 1. The chamber 100 includes an inverted magnetron sputtering source 102 having a cathode 104 which, as best seen in FIGS. 2 and 3A, 3B, is shaped substantially as a hollow torus. The sputtering source 102 further includes an anode 106 which, in the illustrated embodiment, is a generally ring-shaped rod positioned in the interior 110 of the hollow torus cathode 104 and spaced from the interior surface 112 of the cathode 104. Both the cathode 104 and the anode 106 may be made from the material to be sputtered. Such materials include but are not limited to copper, tantalum and titanium.

A relatively large potential difference may be applied between the cathode 104 and the anode 106 to cause electrons to be emitted from the cathode 104 to generate a plasma in the interior 110 of the hollow torus cathode 104. In the illustrated embodiment, a source 116 applies a positive potential to the anode 106 and the cathode 104 is grounded. It is appreciated that a variety of potential differences may be applied between the anode and cathode. However, in some applications, grounding the cathode 104 can simplify the chamber design since many chamber parts including the chamber walls 118 are typically grounded as well. In such applications, electrical isolation between the chamber walls and the cathode 104 can be reduced or eliminated.

Figure 4:
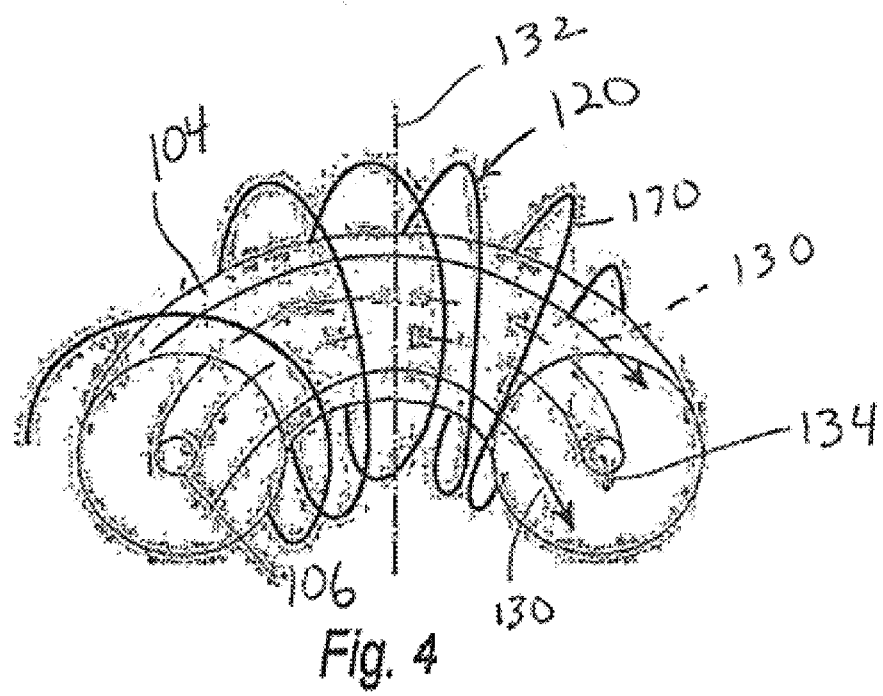
FIG. 4 is a cross-sectional elevational view of the cathode and anode of the source of FIG. 1 showing a torus-shaped coil wound around the cathode.

In the embodiment of FIG. 1, the hollow torus cathode 104 is surrounded by a toroidal electromagnetic coil 120 which, as represented schematically in FIG. 4, is wrapped around the torus-shaped cathode. The toroidal coil 120, when energized by a suitable power source 124 (FIG. 1), generates a closed loop magnetic field 130 which is contained substantially entirely within the interior 110 of the hollow torus cathode 104 due to the corresponding toroidal shape of the coil 120. The magnetic field 130 is azimuthally directed, that is, angularly directed with respect to a center centered on an exterior central axis 132 of the coil 120 and the cathode 104. This azimuthal direction is represented by an arrow 134 in FIG. 4 and is also referred to by the Greek letter "phi."

The magnetic field 130 acts to confine the electrons of the plasma in the vicinity of the cathode sputtering surface 112. The electrons, upon colliding with atoms of a low pressure precursor gas such as argon, ionize the atoms into positively charged ions. These positively charged ions are accelerated toward the cathode 104 and sputter the atoms of the cathode interior surface 112 upon impact. As best seen in FIG. 4, the magnetic field 130 inside the cathode 104 is at most, if not all points, parallel to the interior surfaces 112 of the cathode 104. As a consequence, it is believed that uniformity of sputtering of the cathode interior surface 112 can be enhanced by magnetic fields which are substantially parallel to the sputtering surface 112.

The atoms of deposition material sputtered from the cathode interior surface are alternately redeposited onto the cathode interior surface and resputtered until extracted from the source 102. A percentage of the deposition material sputtered will pass through the apertures 140 (FIGS. 1, 3B and 6B) of a grill 141 formed in the cathode 104 rather than be redeposited onto the cathode interior surface. The apertures 140 are positioned to face a substrate 142 supported by a substrate support such as a chuck 144. Sputtered deposition material exiting the source 102 as indicated by the path arrows 146 will deposit onto the substrate to form a film on the substrate.

A portion of the sputtered deposition material will be ionized by the plasma in the interior of the cathode 104. Since the sputtered metal atoms are well confined inside the hollow torus cathode 104, it is believed that a relatively high percentage of the sputtered atoms of deposition material may be ionized. Accordingly, the source 102 may be considered to be a self-ionized plasma device or "SIP." Depending upon the density of the atoms sputtered from the cathode surface and contained within the hollow torus cathode 104, it is contemplated that the plasma within the interior of the hollow torus cathode may be sustained entirely with the sputtered deposition material atoms and without the aid of a plasma precursor such as argon. In those sputtering sources in which a plasma precursor is used, the plasma precursor has a tendency to be deposited onto the substrate along with the sputtered deposition material. In some applications, deposition of the precursor may be undesirable. In such applications, a sputtering source which reduces or eliminates the use of a plasma precursor such as argon may be particularly suitable.

In addition to confining the sputtered deposition material to enhance the ionization of the material, it is also contemplated that the hollow torus cathode may also function as a radiation shield in a manner similar to that of a coaxial waveguide. For example, the motion of electrons in the plasma in the interior of the cathode 104 may generate RF or microwave power. It is recognized that such electron-generated radiation may be at least partially confined inside the torus to further enhance ionization and plasma density.

The ionized deposition material is accelerated toward the surface 112 of the cathode 104 including the cathode grill 141 and a portion of those deposition material ions will pass through the cathode apertures 140 of the grill 141 rather than being redeposited onto the cathode interior surface 112. Hence, material being deposited onto the substrate will include both ionized as well as neutral atoms of deposition material. However, a negative potential may be applied to the substrate via the substrate support 144 by a suitable source 150 (FIG. 1), to attract ionized deposition material to the substrate. As a consequence, the trajectories of the ionized material may be made more orthogonal to the substrate surface than the trajectories of the neutral sputtered deposition material. For those applications having high aspect ratio vias, channels and other surface features, the uniformity of deposition may be improved, particularly at the bottom and lower sidewalls of the high aspect ratio surface features. Because of the potential applied to the cathode 140 including the cathode grill 141, it is believed that the grill 141 will attract and therefore preferentially pass ionized sputtered deposition material as compared to neutral sputtered deposition material. As a consequence, the percentage of deposition material exiting the source 102 which is ionized may be enhanced or otherwise controlled.

In the illustrated embodiment, the apertures 140 through which the sputtered deposition material passes from the interior of the cathode 104 to the exterior for deposition, are generally triangular-shaped slots as best seen in FIG. 3B. The slots 140 may be positioned on the portion of the cathode 104 (FIGS. 1 and 6B) facing the substrate to direct the flow of sputtered deposition material toward the substrate 142. In the illustrated embodiment, the slots 140 are positioned generally in a ring as shown in FIG. 3B.

Figure 5:
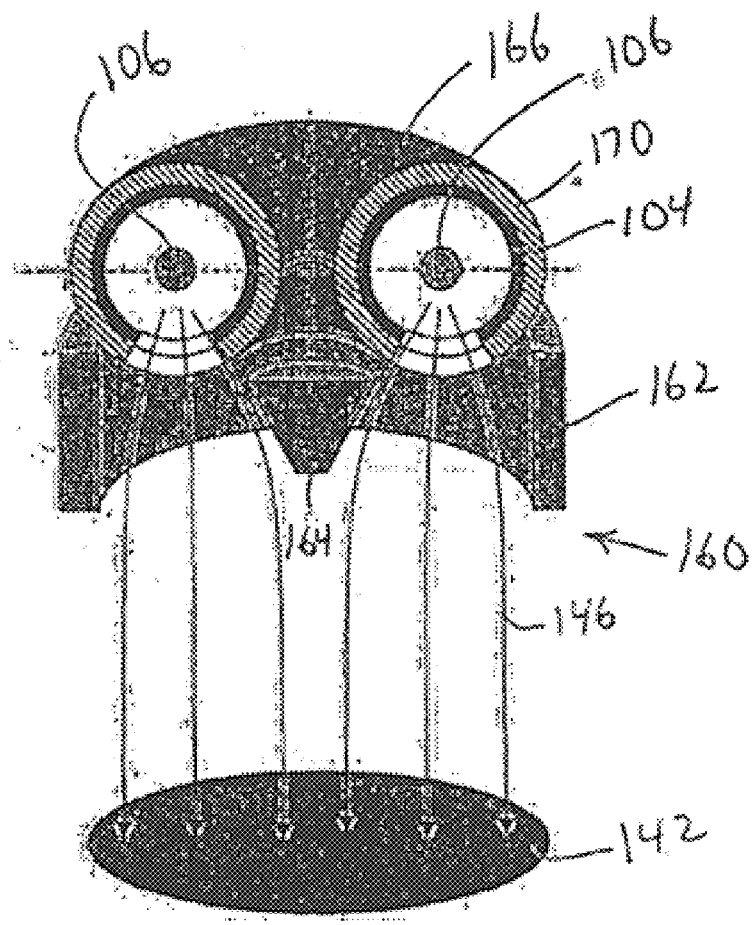
FIG. 5 is a cross-sectional elevational view of an embodiment of the magnetron source of FIG. 1 shown with an electrostatic lens.

In some applications, it may be desirable to provide additional control over the direction of the sputtered material exiting the source 102. FIG. 5 shows an embodiment in which an electrostatic lens structure 160 has been added below the cathode 104 adjacent the slots 140. A positive bias may be applied to the lens structure 160 to deflect and focus the paths 146 of the positively charged ions of deposition material toward a direction which is more orthogonal to the upper surface of the substrate 142. In the illustrated embodiment, the lens structure 160 includes an annular ring 162 positioned adjacent the outer perimeter of the ring of slots 140, and an inverted cone-shaped core 164 positioned within the inner perimeter of the ring of slots 140. It is appreciated that the shapes of the surfaces of the individual pieces of the lens structure as well as the potential and frequency of the applied bias may be varied as appropriate to achieve the desired directionality of the ionized deposition material. In some applications, it may be desired to use the source 116 which biases the anode 106 to bias the lens structure 160.

Figure 6A:
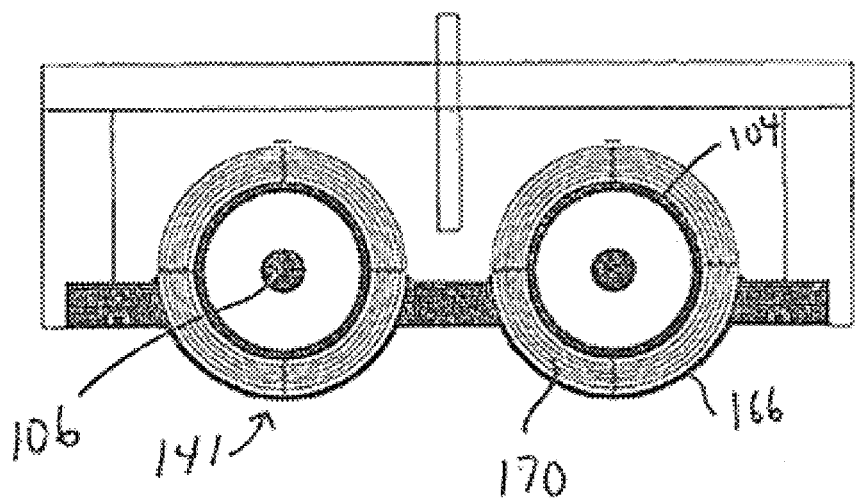
FIG. 6A is a schematic diagram of the upper portion of the deposition chamber of FIG. 1 in accordance with one embodiment in which the torus-shaped magnetron source is shown in a cross-sectional view along the line 6A—6A of FIG. 3B.
Figure 6B:
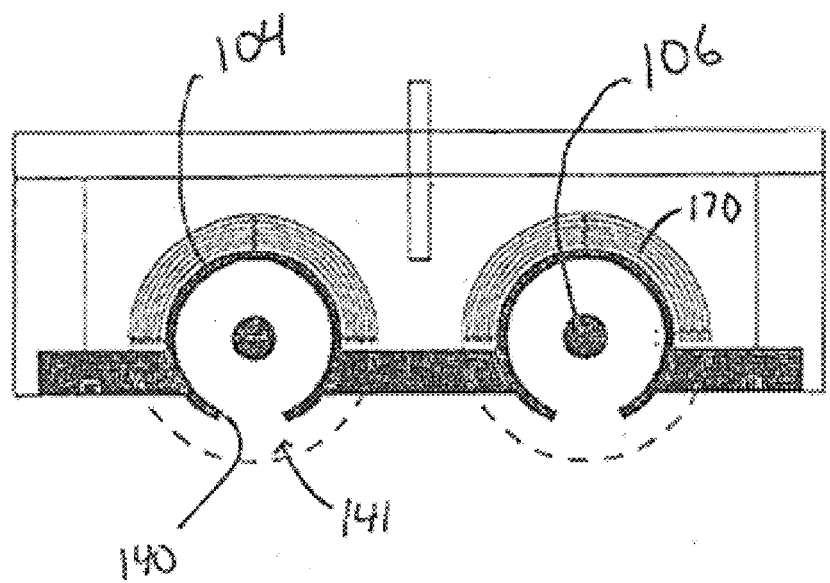
FIG. 6B is a schematic diagram of the upper portion of the deposition chamber of FIG. 1 in accordance with one embodiment in which the torus-shaped magnetron source is shown in a cross-sectional view along the line 6B—6B of FIG. 3B.
Figure 7:
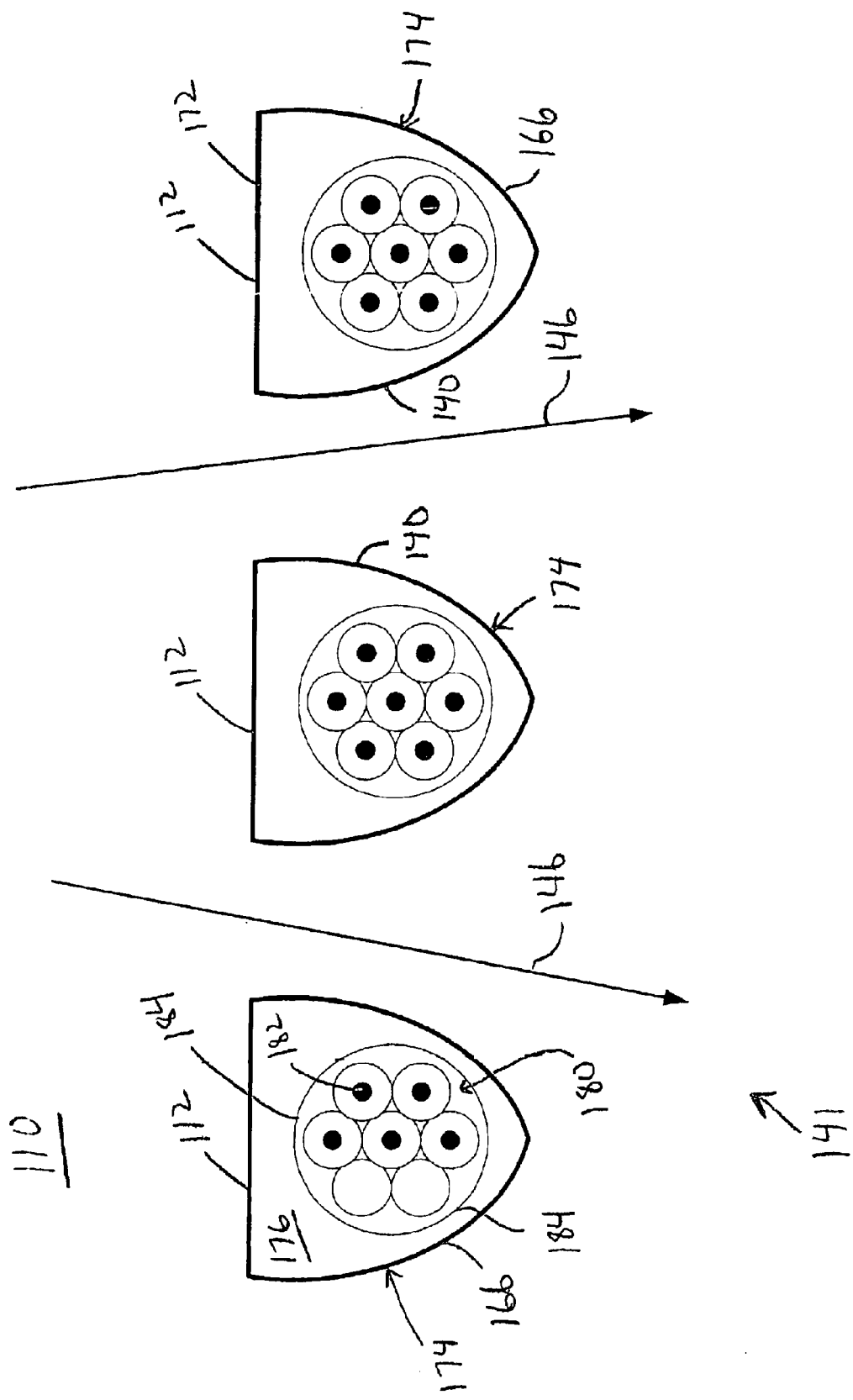
FIG. 7 is a schematic diagram of the apertures of the torus-shaped magnetron source of FIG. 1 as shown in a cross-sectional view along the line 7—7 of FIG. 3B.

The coil 120 may be protected by a suitable outer casing 166 of the source 102 as shown in FIG. 1. The windings 170 of the coil may be wound around the cathode 104 in such a manner than individual windings 170 may be positioned in the grill 141 between adjacent slots 140 as shown in FIGS. 3B, 6A and 6B. FIG. 7 shows a cross-section of the grill portion of the bottom wall 172 (FIG. 3B) of the cathode 104 and the outer casing 166. The grill 141 includes wall segments 174, the space between which defines the slots 140. In the illustrated embodiment, the wall segments 174 are formed from the cathode bottom wall 172 and the outer casing 166 to define a hollow segment interior 176. The interior 176 of each segment 174 may form a coolant carrying channel. Positioned within the coolant carrying channel is a winding 170 which includes a bundle 180 of insulated conductors 182. A cooling fluid such as water may be passed through the channel 176 of each segment 172 to cool the walls of the cathode. The winding bundle 180 may be bound in a watertight sheath 184.

As best seen in FIG. 1, the upper portion 198 of the sputter source 102, opposite the apertures 140, may be cooled by a cooling fluid such as water as well. In the illustrated embodiment, the sputter source upper portion 198 is supported within the chamber lid 200 which defines an upper cooling chamber interior 202 in which cooling water is introduced through a suitable inlet 204. The cooling fluid recirculates in the chamber interior 202, bathing the upper portion 198 of the sputter source 102. The cooling fluid may be discharged from an outlet, cooled and reintroduced through the inlet 204.

The chamber lid 200 is sealed to the chamber walls 118 of the lower body portion 206 by suitable seals 207 which are adapted to maintain a subatmospheric pressure in the interior of the chamber or vessel. If desired, the chamber lid 200 may be electrically isolated from the chamber walls 118 of the lower body portion 206 by a suitable insulative member 208. However, in applications in which both the cathode 104, lid 200 and lower chamber body 206 are at the same potential (such as electrically grounded as shown in FIG. 1), such insulative members may be reduced or eliminated to simplify the design of the chamber.

As indicated above, it is contemplated that the hollow torus cathode 104 may also function as a radiation shield in a manner similar to that of a coaxial waveguide. In addition, the grill 141 may function as a faraday cage to confine the electrons within the cathode torus. This shielding function may be enhanced by reducing the cross-sectional area of each of the apertures 140. In the embodiment of FIG. 3B, the grill apertures 140 are generally triangular-shaped as best seen in FIG. 8a. Alternatively, a grill which also has generally triangularly shaped apertures 210 includes an intermediate current path segment 212 which divides the aperture 210 into two apertures 214 and 216. By providing the additional current path of segment 212, it is believed that the shielding function of the grill may be enhanced.

Figure 8C:
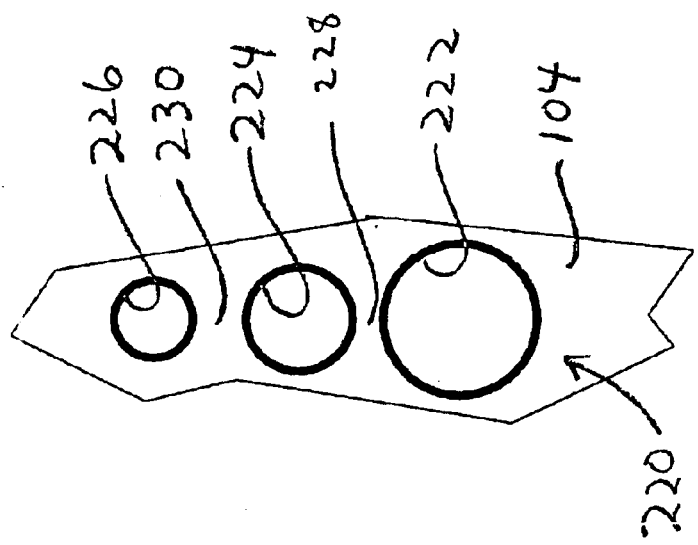
FIGS. 8A–8C depict alternative embodiments of cathode grill apertures.
Figure 8B:
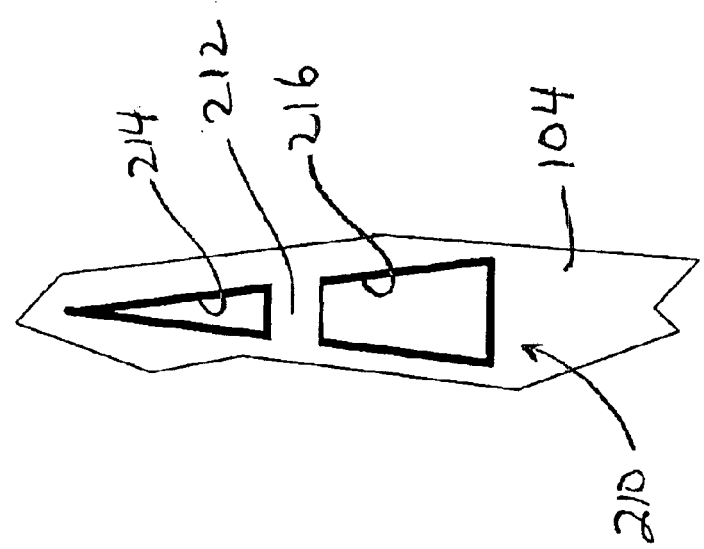
Figure 8A:
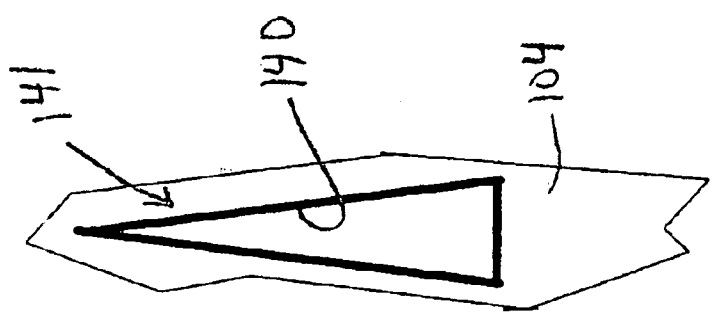

FIG. 8c shows a grill embodiment having a generally triangular shaped slot 220 which includes three round-shaped apertures 222, 224 and 226 of decreasing diameter, and two current path segments 228 and 230 separating the apertures of the grill into rows. It is appreciated that the size, shape and positions of the apertures of the cathode grill may be modified as appropriate to achieve the desired deposition rate and deposition pattern.

As used herein, the term "torus" is used to refer to a tubular structure which closes on itself. Such a tubular structure has one or more exterior axes such as the central exterior axis 132, about which the tubular structure encircles or forms a closed loop. One example of such a torus shaped source has the same shape as an imaginary doughnut shaped geometric surface which is generated by rotating a closed two-dimensional shape such as a circle about a central exterior axis which is in the same plane as the circle but not intersecting it. An imaginary geometric surface having the shape of the toroidal shaped cathode 104 of FIG. 2 may be generated by rotating the cross-sectional circular segment 260 a full 360 degrees around the central exterior axis 132 which is in the same plane as the circular segment 260 but does not intersect the segment 260.

It is contemplated that a source in accordance with the present invention may have other torus-like or toroidal shapes. For example, the cross-sectional shape of a torus having the shape of an imaginary geometric surface which is generated by rotating a cross-sectional shape around a nonintersecting central exterior axis may have shapes other than circular. For example, the cross-sectional shape of the tubular segment in a plane containing the central axis may be square, oval, diamond, rectangular or other polygon and curved shapes.

In the example of FIG. 2, the imaginary toroidal geometric surface having the shape of the tubular structure may be formed by rotating a circular segment 260 at a constant radius about the central axis 132. Thus, the cathode 104 has a circular shape (of which a half circle is shown in the cross-sectional view of FIG. 2) in a plane 262 orthogonal to the central exterior axis 132. It is appreciated that the surface of the tubular structure need not have a shape which is the same as that of an imaginary geometric shape which is formed by a constant radius of rotation. Instead, the radius of rotation of the representative geometric shape may vary so that the tubular structure has shapes other than circular in a plane orthogonal to the central axis or axes of rotation. Such shapes of the tubular structure include square, oval, diamond, rectangular and other curved and polygon shapes in the plane orthogonal to the axes of rotation.

Still further, it is appreciated that the toroidal surface of the cathode need not be regular or symmetrical. Instead, it is contemplated that the shape of segments of the tubular structure may vary at different locations around the structure. Furthermore, the centers of the segments need not be coplanar but may be displaced relative to each other in a direction parallel to a central exterior axis or axes.

Figure 9:
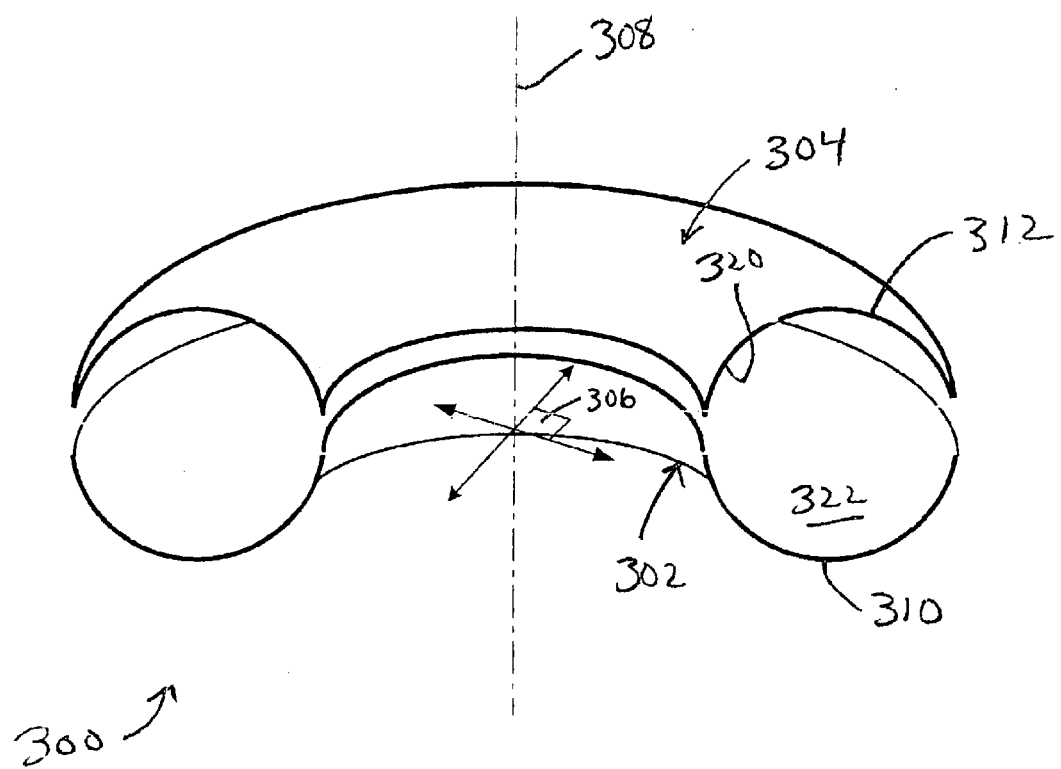
FIG. 9 is a cross-sectional elevational view of a torus-shaped sputter source in accordance with an alternative embodiment having a partial toroidal cathode and a partial toroidal anode in which concave surfaces face each other.

It is further contemplated that a deposition material source in accordance with the present inventions may be used in a variety of different types of deposition chambers. Such chambers may optionally have additional targets which may have a variety of shapes including planar, concave, convex, coil and toroidal. Still further, ions and ionization energy may be provided by a variety of supplemental sources including microwave generators, capacitors and inductively coupled coils, FIG. 9 shows a schematic representation of a sputter source according to an alternative embodiment in which the torus-shaped source 300 is split into two portions, a cathode portion 302 and an anode portion 304. The anode and cathode of the tubular source are split in a plane 306 which is orthogonal to a central axis of rotation 308 of the torus. The partial toroidal surface of the cathode portion 302 of the tubular structure may be represented by a geometrical surface formed by rotating an arc-shaped segment 310 at a constant radius about the central axis 308. The cathode portion 302 is positioned in the chamber to face the substrate and contains a plurality of apertures to permit the passage of sputtered material from the interior of the source 302 to the exterior and towards the substrate in a manner similar to that of the source 102 of FIG. 1.

Rather than a ring shaped anode such as the anode 106 of FIG. 1, the anode 304 of the source 300 of FIG. 9 has a partial toroidal shape which, like the cathode 302, may be represented by a geometrical surface formed by rotating an arc-shaped segment 312 at a constant radius about the central axis 308. The concave interior surface 320 of the anode portion 304 is positioned in the chamber to face the concave interior surface 322 of the cathode 302 but is preferably insulated from the cathode 302. The cathode and anode of the source 300 are surrounded by a toroidal magnetic coil similar to the coil 120 of FIG. 4. In the same manner as the coil 120, the coil wrapped around the source 300 when energized by a suitable power source generates a closed loop magnetic field which is contained substantially entirely within the interior defined by the cathode 302 and the anode 304 due to the corresponding toroidal shape of the coil and the source 300. The anode 304 may be biased by a suitable power source to generate a plasma and to induce sputtering of the cathode 302 in a manner similar to that of the source 102 described above.

Figure 10:
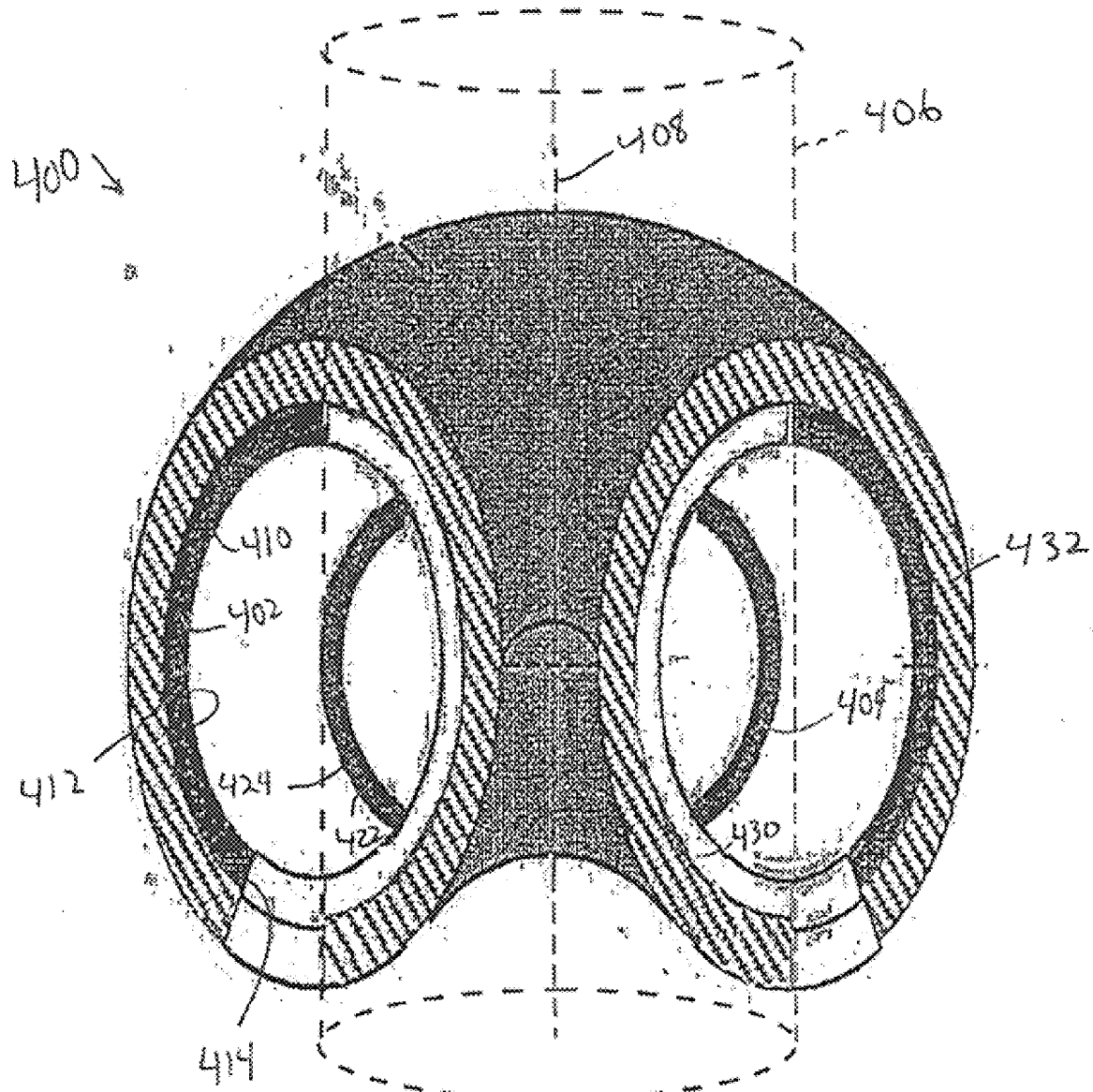
FIG. 10 is a cross-sectional elevational view of a torus-shaped sputter source in accordance with another alternative embodiment having a partial toroidal cathode and a partial toroidal anode in which a concave surface faces a convex surface.

A sputtering source 400 in accordance with yet another embodiment is shown in FIG. 10. In this embodiment, the torus-shaped source 400 is again split into two portions, a cathode portion 402 and an anode portion 404. However, the torus of the tubular source is split along an imaginary cylindrical surface 406 which is centered on a central axis of rotation 408. The partial toroidal surface of the cathode portion 402 of the tubular structure may again be represented by a geometrical surface formed by rotating an arc-shaped segment 410 at a constant radius about the central axis 408. The cathode portion 402 is positioned in the source 400 of the chamber such that the concave interior surface 412 of the cathode 402 faces the central axis 408. A portion of the cathode 402 which faces the substrate contains a plurality of apertures 414 to permit the passage of sputtered material from the interior of the source 402 to the exterior and towards the substrate in a manner similar to that of the source 102 of FIG. 1.

The anode 404 of the source 400 of FIG. 10 has a partial toroidal shape which, like the cathode 404, may be represented by a geometrical surface formed by rotating an arc-shaped segment 422 at a constant radius about the central axis 408. However, radius of rotation for the arc-shaped segment 422 of the anode 404 is smaller than the radius of rotation of the arc-shaped segment 410 of the cathode 402 such that the convex exterior surface 424 of the anode partial toroidal portion 404 is positioned in the source 400 to face the concave interior surface 412 of the cathode partial toroidal portion 402. The arc shaped segments 410 and 422 are preferably shaped such that the opposing surfaces of the cathode and anode are spaced and generally parallel.

The anode 404 is supported within the source 400 by a third partial toroidal-shaped portion 430 which may be made of an insulative material. Alternatively, the portion 430 may be made of a conductive material and biased in the same manner as the anode 404 such that the portion 430 functions as a part of the anode of the source 400. However, the portion 430 should be electrically insulated from the cathode 402 which would be at a different electrical potential to maintain the plasma.

The source 400 is surrounded by a toroidal electromagnetic coil 432 similar to the coil 120 of FIG. 4. In the same manner as the coil 120, the coil wrapped around the source 400 when energized by a suitable power source generates a closed loop magnetic field which is contained substantially entirely between the cathode 402 and the portion 430 due to the corresponding toroidal shape of the coil 432 and the source 400. The azimuthal lines of force are again substantially parallel to the facing surfaces of the cathode and anode. The anode 404 may be biased by a suitable power source to generate a plasma and to induce sputtering of the cathode 402 in a manner similar to that of the source 102 described above.

Figure 11:
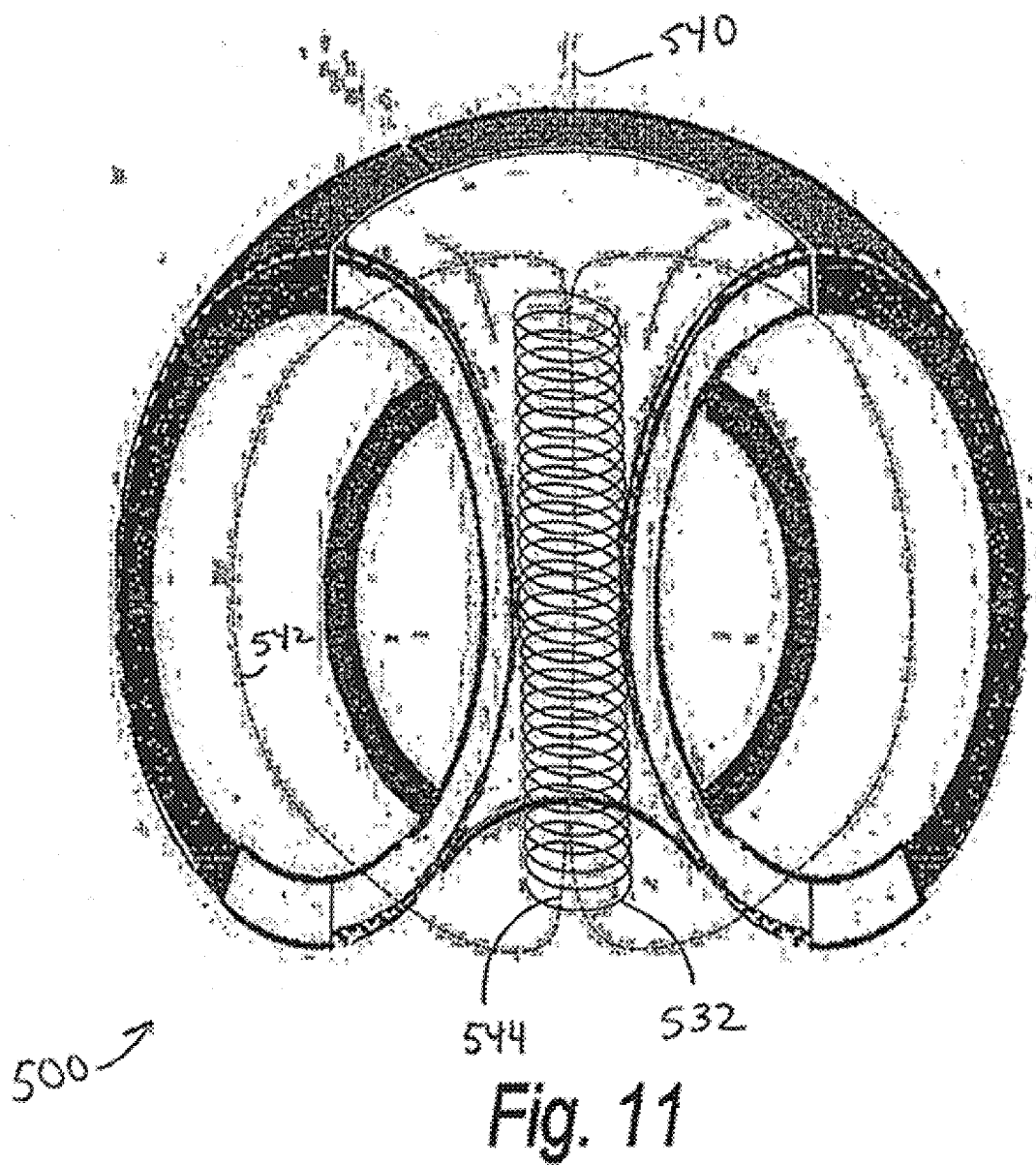
FIG. 11 is a cross-sectional elevational view of a torus-shaped sputter source having partial toroidal cathode and anode as shown in FIG. 10 and having a central cylindrical coil.

In yet another alternative embodiment, a source 500 depicted schematically in FIG. 11 includes a cathode 402 and an anode 404 similar to the cathode and anode of the source 400 of FIG. 10. In this embodiment, rather than a toroidal coil surrounding the cathode and anode, the source 500 includes a cylindrical electromagnetic coil 532 which is positioned co-axially with the central exterior axis of symmetry 540. Instead of an azimuthally directed magnetic field, the coil 532 produces a longitudinally directed field 542 between the anode and cathode surfaces. However, it is believed that the field 542 will be substantially parallel to the surfaces of the anode and cathode for those portions of the field which are located between the anode and cathode. Although a portion 544 of the field 542 which passes through the core of the coil 532 will be substantially parallel to the source axis 540 rather than the surfaces of the anode and cathode, it is believed that advantageous results may still be obtained since the sputtering will take place primarily between the facing surfaces of the anode and cathode.

Although the sources of the magnetic fields such as the electromagnetic coil 532 are depicted as electromagnets, it is appreciated that permanent magnets may be used to generate magnetic fields as well. Thus, for example, in the embodiment of FIG. 11, one or more permanent magnets may be used instead of or in addition to the electromagnet 532.

Again, it is contemplated that in each of the embodiments described herein, the shapes of the tubular structures may vary, depending upon the Again, it is contemplated that in each of the embodiments described herein, the shapes of the tubular structures may vary, depending upon the application. It will, of course, be understood that other modifications of the illustrated embodiments, in their various aspects, will be apparent to those skilled in the art, some being apparent only after study, others being matters of routine mechanical and electronic design. Other embodiments are also possible, their specific designs depending upon the particular application. As such, the scope of the invention should not be limited by the particular embodiments described herein but should be defined by the appended claims and equivalents thereof.

What is claimed is:

1. A source of deposition material, comprising:
 a cathode having a torus-shaped interior sputtering surface which defines a torus-shaped interior of said cathode; and
 an anode positioned in the interior of said cathode and spaced from the cathode sputtering surface; wherein said cathode defines a central axis exterior to said cathode and said cathode interior sputtering surface defines a central interior axis which is ring-shaped and forms a closed loop around said exterior central axis, said anode being ring-shaped and defining a ring-shaped center axis coaxially aligned with said cathode central interior axis.

2. The source of claim 1 wherein said ring-shaped anode has a circular cross-section in a plane orthogonal to said central axis.

3. The source of claim 1 wherein said cathode has a circular cross-section in a plane orthogonal to said central axis.

4. The source of claim 3 wherein said cathode has a circular cross-section in a plane which contains said central axis.

5. The source of claim 1 further comprising a coil having a plurality of windings, each winding encircling a portion of said cathode to provide a torus-shaped magnetic field in the interior of said cathode and encircling said central axis.

6. The source of claim 5 wherein said cathode sputtering surface is formed of a sputterable deposition material and said cathode has a plurality of apertures positioned between windings to discharge sputtered deposition material from the interior of said cathode.

7. The source of claim 6 for use with a coolant wherein said cathode defines an internal channel positioned between adjacent apertures and adapted to receive a flow of said coolant, and wherein a winding is positioned within said channel.

8. The source of claim 1 wherein said cathode sputtering surface is formed of a sputterable deposition material and said cathode has a plurality of apertures positioned to discharge sputtered deposition material from the interior of said cathode.

9. The source of claim 8 wherein said plurality of apertures is distributed in a ring-shaped pattern which substantially encircles said central axis.

10. The source of claim 9 wherein each aperture is triangular shaped.

11. The source of claim 9 wherein said pattern includes a plurality of segments, wherein each segment Includes a plurality of said apertures distributed in a triangular-shaped pattern.

12. The source of claim 8 for depositing ionized deposition material onto a substrate, said source further comprising a plasma generation area positioned within said cathode wherein a plasma generated within said area ionizes sputtered deposition material prior to be discharged from the interior of said cathode, said source further comprising a lens positioned between said apertures and said substrate and adapted to deflect the trajectory of ionized deposition material.

13. The source of claim 12 wherein said plurality of apertures are distributed in a ring-shaped pattern which substantially encircles said central axis and wherein said lens includes an annular shaped ring disposed adjacent said ring-shaped pattern and an electrical source adapted to bias said lens ring.

14. The source of claim 13 wherein said lens further includes a frusto-conical shaped core centered within said lens ring wherein said ionized deposition material discharged from said apertures passes between said lens core and said lens ring.

15. The source of claim 1 wherein said cathode is biased at electrical ground.

16. The source of claim 1 further comprising a magnet positioned to provide a toroidal-shaped magnetic field oriented parallel to said interior sputtering surface.

17. A source of deposition material, comprising:
 a vessel having a toroidal-shaped plasma generation region adapted to contain a plasma for ionizing deposition material; said vessel including a cathode having an exterior surface facing away from said plasma generation region, and an interior sputtering surface formed of a deposition material and facing at least a portion of said plasma generation region, said cathode having a plurality of passageways positioned between said exterior surface and said sputtering surface and oriented to permit ionized sputtered deposition material discharged from said plasma generation region, to pass through the cathode and to the exterior of said of said cathode; and an anode positioned within said vessel adjacent to said plasma generation region and facing said cathode interior sputtering surface.

18. The source of claim 17 wherein said vessel has a toroidal shape which defines a central axis, said vessel including an inner wall encircling said central axis and an outer wall encircling said central axis and said inner wall, wherein said plasma generation region is positioned between said inner wall and said outer wall and said cathode includes at least a segment of said outer wall.

19. The source of claim 18 wherein said outer wall segment of said cathode is a closed loop encircling said central axis.

20. The source of claim 18 wherein said anode includes at least a segment of said inner wall.

21. The source of claim 20 wherein said inner wall segment of said anode is a closed loop around said central axis.

22. The source of claim 21 wherein said outer wall segment has a concave inner surface which forms said cathode sputtering surface wherein said cathode sputtering surface is a closed loop encircling said central axis and wherein said inner wall segment has a convex outer surface which forms said anode facing said cathode sputtering surface and wherein said anode is a closed loop encircling said central axis.

23. The source of claim 21 wherein said convex anode surface is generally parallel to said concave cathode sputtering surface.

24. The source of claim 23 further comprising an electromagnet coil aligned with said central magnet and positioned to provide a magnetic field generally parallel to and between said convex anode surface and said concave cathode sputtering surface.

25. A source of deposition material, comprising:
 a vessel having a plasma generation region adapted to contain a plasma for ionizing deposition material; said vessel including a cathode having an exterior surface facing away from said plasma generation region, and an interior sputtering surface formed of a deposition material and facing at least a portion of said plasma generation region, said cathode having a plurality of passageways positioned between said exterior surface and said sputtering surface and oriented to permit ionized sputtered deposition material discharged from said plasma generation region, to pass through the cathode and to the exterior of said of said cathode; and an anode positioned within said vessel adjacent to said plasma generation region and facing said cathode interior sputtering surface.

26. A chamber for depositing ionized sputtered deposition material onto a semiconductor substrate, comprising:
 a vessel adapted to contain a subatmospheric pressure;
 an electromagnetic coil adapted to provide a torus-shaped magnetic field inside said vessel to define a plasma generation area to ionize deposition material;
 a cathode having an interior sputtering surface facing and encircling said magnetic field having an exterior surface facing toward said substrate, said cathode having a plurality of passageways defined by said exterior surface and oriented to permit ionized sputtered deposition material discharged from said plasma generation region, to pass through the cathode and to the exterior of said cathode; and
 an anode positioned within said vessel adjacent to said field and facing said cathode interior sputtering surface.

27. The chamber of claim 26 wherein said cathode has an upper surface and said vessel includes a coolant chamber adapted to receive a flow of coolant and wherein said coolant chamber includes said cathode upper surface and said coolant chamber is configured to direct said flow of coolant to come into contact with said cathode upper surface.

28. A method of sputtering material onto a semiconductor workpiece, comprising:
 pumping down the interior pressure of a vessel having a semiconductor workpiece; and
 applying a potential difference between a cathode having a torus-shaped interior sputtering surface which defines a torus-shaped interior of said cathode and an anode positioned in the interior of said cathode and spaced from the cathode sputtering surface, to generate a plasma within said cathode interior and to cause said sputtering surface to sputter deposition material, wherein
  said cathode has a plurality of apertures positioned to discharge sputtered deposition material from the interior of said cathode, said method further comprising positioning said semiconductor workpiece within said vessel interior to face said sputtering surface apertures to receive sputtered deposition material from the interior of the cathode.

29. The method of claim 28 further comprising applying a toroidal-shaped magnetic field oriented parallel to said interior sputtering surface.

30. The method of claim 28 wherein sputtered deposition material is ionized within said cathode interior, the method further comprising deflecting the trajectory of ionized deposition material using an electric field generated by an electrostatic lens positioned on the exterior of said cathode.

31. The method of claim 28 wherein said plurality of apertures are distributed in a ring-shaped pattern and wherein said lens includes an annular shaped ring disposed adjacent said ring-shaped pattern, said method including biasing said lens ring to generate said electric field.

32. The method of claim 31 wherein said lens further includes a frusto-conical shaped core centered within said lens ring wherein said ionized deposition material discharged from said apertures passes between said lens core and said lens ring.

33. The method of claim 28 wherein said cathode is biased at electrical ground.

34. The method of claim 33 further comprising directing a flow of coolant in thermal contact with said cathode.

35. A method of sputtering deposition material, comprising:
 generating a plasma between a cathode and an anode to sputter an interior surface of said cathode racing said plasma and to ionize deposition material sputtered from said cathode; and
 directing ionized deposition material through a plurality of apertures in said cathode to the exterior of said cathode and onto a substrate.

36. The method of claim 35 wherein said plasma is torus-shaped.

37. The method of claim 36 further comprising applying a toroidal-shaped magnetic field in said plasma.

38. The method of claim 36 further comprising deflecting the trajectory of ionized deposition material using an electric field generated by an electrostatic lens positioned on the exterior of said cathode.

39. The method of claim 38 wherein said plurality of apertures are distributed in a ring-shaped pattern and wherein said lens includes an annular shaped ring disposed adjacent said ring-shaped pattern and an electrical source adapted to bias said lens ring.

40. The method of claim 39 wherein said lens further includes a frusto-conical shaped core centered within said lens ring wherein said ionized deposition material discharged from said apertures passes between said lens core and said lens ring.

41. The method of claim 35 wherein said cathode is biased at electrical ground.

42. The method of claim 41 further comprising directing a flow of coolant in thermal contact with said cathode.

43. A source of deposition material for a substrate, comprising:

a substrate holder;

means for generating a tows-shaped plasma including a torus-shaped cathode having an interior sputtering surface which defines a center axis, and a ring shaped anode positioned spaced from but facing said cathode sputtering surface and forming a closed loop around said cathode center axis, said cathode having a plurality of apertures distributed around said cathode in a ring facing said holder;

means for generating a tows-shaped magnetic field in said plasma wherein said plasma sputters deposition material from said sputtering surface and ionizes sputtered deposition material; and means for directing ionized deposition material through said plurality of apertures in said cathode to the exterior of said cathode and onto a substrate.

44. A source of deposition material, comprising:

a toroidal-shaped vessel having an interior which defines a toroidal-shaped plasma generation region adapted to contain a plasma for ionizing deposition material; said vessel including a toroidal-shaped cathode having an exterior surface facing away from said plasma generation region, and a toroidal-shaped interior sputtering surface formed of a deposition material and facing at least a portion of said plasma generation region, said cathode having a plurality of passageways positioned in a ring-shaped pattern between said exterior surface and said sputtering surface and oriented to permit ionized sputtered deposition material discharged from said plasma generation region, to pass through the cathode and to the exterior of said of said cathode; a ring-shaped anode positioned within said vessel within said plasma generation region and facing said cathode interior sputtering surface; and a toroidal-shaped electromagnetic coil disposed around said cathode to provide a toroidal-shaped magnetic field in said plasma generation area.

* * * * *